United States Patent

[11] 3,588,632

[72] Inventor Josuke Nakata
1302-3 Miwa Sanda-Shi, Sanda-shi,Myogo-ken, Japan

[21] Appl. No. 774,777
[22] Filed Nov. 12, 1968
[45] Patented June 28, 1971

[73] Assignee Mitsubishi Denki Kabushiki Kaisha, Tokyo, Japan.

[54] STRUCTURALLY REINFORCED SEMICONDUCTOR DEVICE
2 Claims, 7 Drawing Figs.

[52] U.S. Cl. .......... 317/234, 317/235
[51] Int. Cl. .......... H01l 5/00
[50] Field of Search .......... 317/234, 235, (3), (47), (5.4), (48.7)

[56] References Cited

UNITED STATES PATENTS

| | | | |
|---|---|---|---|
| 2,882,465 | 4/1959 | Macdonald | 317/235 |
| 2,893,904 | 7/1959 | Dickson | 148/33 |
| 2,959,718 | 11/1960 | Kadelburg et al. | 317/234 |
| 2,980,832 | 4/1961 | Stein et al. | 317/235 |
| 3,224,069 | 12/1965 | Thorne | 29/25.3 |
| 3,328,650 | 6/1967 | Boyer | 317/234 |
| 3,457,474 | 7/1969 | Weisshaar et al. | 317/234 |

*Primary Examiner*—James D. Kallam
*Assistant Examiner*—William D. Larkins
*Attorneys*—F. Shapoe and C. L. Menzemer

ABSTRACT: This disclosure relates to a semiconductor device, including a semiconductor element, which has been structurally reinforced by one or more annular members whereby, the element is able to withstand temperature cycling.

STRUCTURALLY REINFORCED SEMICONDUCTOR DEVICE

FIELD OF INVENTION

This invention is in the field of semiconductor devices broadly and is specifically concerned with structure or configuration of a semiconductor device.

PRIOR ART

Wafers of semiconductive material such as silicon and germanium are generally brittle and apt to damage or break in the process of forming a PN junction within the wafer or brazing or soldering an electrode thereto. In order to prevent the wafers from being damaged or broken it has been previously practiced to prepare a reinforcing plate of any suitable material such as molybdenum, tungsten, tantalum, or an iron-nickel-cobalt alloy such as that sold commercially under the trademark having a coefficient of thermal expansion approximating that of a semiconductive material involved, and to braze or solder the reinforcing plate to either one or both of the entire main faces of semiconductor wafer with a layer of any suitable brazing or soldering material during the process of forming one or more PN junctions within the semiconductor wafer or immediately after the formation of the junctions in the wafer.

As the need to increase the capability and dielectric strength of semiconductor devices, semiconductor elements have been increased in both transverse dimension or radius and thickness. This increase in radius of the semiconductor wafer and element has resulted in an increase in radius of the associated reinforcing plate because of the necessity of joining the reinforcing plate to the entire main face of the wafer. That is, joining of the reinforcing plate to the semiconductor wafer should be accomplished with a relatively large area of the interface of the plate and wafer.

The semiconductor wafer and reinforcing plate or plates are subject to heat due to the joining of them, a flow of load current therethrough in operation both of which cause them to expand, and both also respond to the removal of such heat which causes them to contract. Assuming that the semiconductor wafer is of a circular section, its radial expansion will be considered. In this event the semiconductor wafer and the reinforcing disc joined thereto will radially expand to increase in radius. As previously described, the material for the reinforcing plate has a coefficient of thermal expansion approximating that of the material of the semiconductor wafer but their coefficients of thermal expansion are slightly different from each other. For example, it is assumed that the reinforcing plate is greater in coefficient of thermal expansion than the semiconductor element. Under the assumed condition an increase in radius of the reinforcing plate due to its thermal expansion is greater than an increase in radius of the semiconductor wafer due to its thermal expansion. With the reinforcing plate joined to the entire main face of the semiconductor wafer, this causes the wafer to undergo a force tending to bend it convexly toward the plate at the interface resulting in a flexure of the wafer whose magnitude is proportional to the square of the radius of the wafer or plate. Thus the larger the radius of the semiconductor wafer and therefore of the reinforcing plate the greater the magnitude of flexure will be. This leads to the occurrence of a high strain in the semiconductive material of the wafer which significantly affects the electric characteristics of the resulting device. In the extreme case, the semiconductor wafer and especially the outer peripheral portion thereof may be cracked.

The stress or strain developed in the semiconductive material increases proportionally not only to the difference between the coefficients of thermal expansion of the semiconductive and reinforcing materials and the transverse dimension but also to the thickness of the semiconductor wafer. With the semiconductor wafer increased in both transverse dimension and thickness, a considerably high stress is developed in the material for the semiconductor wafer and particularly a considerably high shearing force is developed on the outer peripheral portion of the wafer resulting in the occurrence of cracks on that portion or in a great decrease in capability thereof. It has been found that with a semiconductor wafer having a diameter exceeding 30 mm. and a thickness exceeding 0.6 mm. even a very small difference between coefficients of thermal expansion of the semiconductor and reinforcing materials can exhibit the significant adverse effects upon the electric characteristics of a PN junction involved.

Accordingly, it is an object of the invention to provide a new and improved semiconductor device preventing a high strain from occurring in the material for a semiconductor element involved even though the device increases in transverse dimension or radius and/or thickness.

SUMMARY OF THE INVENTION

According to the invention, there is provided a semiconductor device comprising a semiconductor wafer having a pair of opposite main faces, and a reinforcing element attached to at least one of the main faces of the wafer, characterized in that the reinforcing element is in the form of an annulus joined to the outer peripheral portion of the one main face of the wafer, the reinforcing element being composed of at least one material selected from the group consisting of materials of the same type as that for the semiconductive wafer and materials having coefficients of thermal expansion approximating that of the material for the semiconductive wafer.

When the semiconductor wafer consists of semiconductive silicon, the reinforcing element is preferably comprised of at least one material selected from the group consisting of silicon, germanium, molybdenum, tungsten, tantalum, an iron-nickel-cobalt alloy sold under the trademark Kovar, alumina and zirconia.

The invention will become more apparent from the following detailed description taken in conjunction with the accompanying drawing in which:

BRIEF DESCRIPTION OF THE DRAWING

Referring now to FIG. 1 it is seen that a semiconductor element generally designated by the reference numeral 10 comprises a wafer 11 of a suitable semiconductor material as for example, silicon or germanium, including an N-type substrate 12 having a high resistivity, a P type diffusion layer 14 disposed on one surface, in this case, the lower surface as viewed in FIG. 1 of the substrate 12 to form a PN junction 16 therebetween and an $N^+$ type diffusion layer 18 disposed on the other or upper surface of the substrate 12 to form an $NN^+$ junction 20. In the example illustrated in FIG. 1 the wafer was made of N type silicon into a circular disc shape having a diameter of approximately 35 mm. and a thickness of 0.6 mm. A P type impurity such as gallium was diffused into the lower surface of the wafer to form the P type diffusion layer 14 and N type impurity such as phosphorous was diffused into the upper surface of the wafer to a surface concentration of $1\pm10^{20}$ atoms of phosphorous per cubic centimeter or more to form the $N^+$ type diffusion layer 18. The exposed surfaces of both diffusion layers 14 and 18 were lapped into parallel planes.

Figure 1:
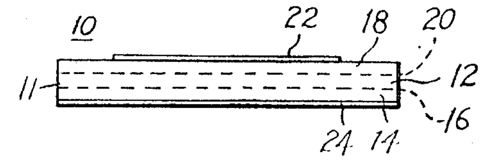
FIG. 1 is a side elevational view of a semiconductor element used in a semiconductor power diode; to which the invention is applicable.

A metal such as for example aluminum was vapor deposited onto the lapped surface of the $N^+$ type diffusion layer 18 to form a metal deposited layer 22 in the form of a circle concentric with the circle of the wafer 11 and in this case having a diameter of approximately 31 mm. Similarly, an aluminum layer 24 was deposited on the entire lapped surface of the P type diffusion layer 14. The aluminum layers 22 and 24 each should have a thickness sufficient to prevent the element 10 from flexing due to heat. It has been found that for the element having the dimension as above specified, the aluminum layers preferably have a thickness of 20 microns or less with the optimum thickness ranging from 5 to 10 microns. After the vapor deposition of the aluminum layers, the element 10 is heated at a temperature of from 500° to 600° C. and preferably about 577° C. to sinter the aluminum in the layers 22 and 24 into the adjacent diffusion layers thereby forming ohmic contacts low in electric resistance with the diffusion layers. This sintering of aluminum is required only in the case the aluminum layers 22 and 24 are also intended to be used as contacts or electrodes for the element 10. Otherwise the sintering of the aluminum may be omitted. The semiconductor element 10 thus produced is suitable for use as a semiconductor power diode including a cathode and an anode electrode composed of the aluminum layers 22 and 24 respectively.

Figure 2:
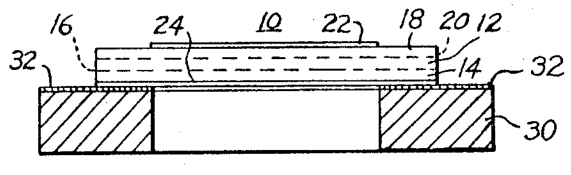
FIG. 2 is a side elevational view, partly in secton of the semiconductor element of FIG. 1 having joined thereto a reinforcing element according to the invention.

With reference to FIG. 2, in order to reinforce the semiconductor element 10, an annular member 30 having an outside diameter slightly greater than the diameter of the element 10 and comprised of the same material as the wafer, in this case silicon. The material for the annular member 30 is not required to be monocrystalline and may be inferior in purity to that of the wafer 11. The annular member 30 can readily be formed into any desired shape as by the sandblasting or ultrasonic technique. With the semiconductor element 10 having the dimension as previously specified, the annular member 30 is preferably in the form of a toroid of rectangular cross section having an outside diameter of from 35 to 37 mm., an inside diameter of from 31 to 32 mm. and a thickness of from 0.6 to 1.0 mm. Then both end faces of the annular member 30 are lapped into parallel planes and aluminum is vapor deposited on the entire area of one of the lapped faces to a thickness of from 5 to 10 microns. In FIG. 2, the reference numeral 30 denotes the reinforcing annular member thus prepared and the reference numeral 32 denotes an aluminum layer deposited on one of the end faces, in this case, the upper end face as viewed in FIG. 2.

The semiconductor element 10 is then disposed and centered on the reinforcing annular member 30 with the aluminum layer 24 on the element contacting the aluminum layer 32 on the member 30. The assembly consisting of the element 10 and member 30 is heated to a temperature of from approximately 650° to 700° C. in a vacuum atmosphere to fuse both the aluminum layers 24 and 32 together thereby rigidly securing the element 10 to the member 30. FIG. 2 illustrates the structure after the element 10 has been rigidly secured to the member 30. The member 30 is joined only to the outer peripheral portion of the semiconductor element 10 and serves as a support for reinforcing the element 10.

Figure 3:
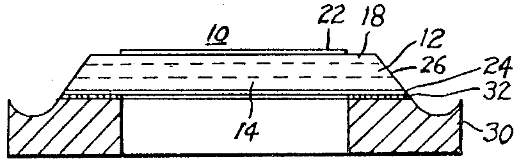
FIGS. 3 and 4 are views similar to FIG. 2 but illustrating the semiconductor reinforcing elements as shown in FIG. 2 in different manufacturing processes.

The periphery of the element 10 at which the junctions 16 and 20 terminate and the adjacent portion of the reinforcing member 30 are shaped into a frustocone by any well-known technique for example, by sandblasting, as shown by the reference numeral 26 in FIG. 3. This measure is well known in the art and has the purpose of alleviating a strength of electric field adjacent that portion of the peripheral element surface to which the PN junction 16 is exposed. After the shaping operation, any suitable process such as by the spraying process is used to coat any suitable wax, for example, a wax sold commercially under the trademark Apiezon wax on the surface of the assembly including the aluminum layer 22, the exposed portion of the aluminum layer 24 and the lower surface of the reinforcing member 30 but not the shaped periphery of the semiconductor element 10 to form an acid-resisting mask thereon. The coated assembly is then etched with any suitable etching solution such as one including, by volume, five parts of nitric acid three parts of fluoric acid, and three parts of glacial acetic acid to remove the surface strains due to the sandblasting operation from the periphery of the semiconductor element. Thereafter it is rinsed with de-ionized water, washed, and dried in the conventional manner for the purpose of stabilizing the surface condition of the semiconductor element.

Figure 4:
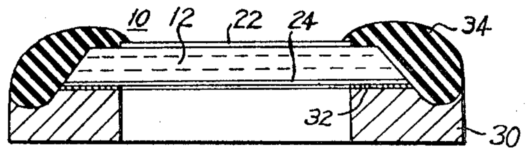

As shown in FIG. 4 a layer 34 of room temperature vulcanization type silicone rubber is disposed on the shaped periphery 32 of the element 10 and the adjacent portion of the assembly. The layer is fully vulcanized and heated to be dried into a desired shape. If desired the silicon rubber 34 may be omitted.

The finished assembly can be placed into and fixed in place in any suitable enclosed casing with the aluminum deposited layers 22 and 24 contacting respectively plane lapped surfaces of two supporting plates under pressures provided by any suitable pressure mechanism disposed within the casing on the opposite sides. This measure is well known in the art and not illustrated in FIG. 4.

If a semiconductor element has a reinforcing element of molybdenum, tantalum or tungsten attached to the entire area at one of the main faces thereof as in the prior art practice then heat applied to or generated in the semiconductor element during manufacturing or in operation respectively can flex the latter due to a difference in coefficient of thermal expansion between the materials for both the elements even though that difference is small. This results in the occurrence of cracks on the outer peripheral portion of the semiconductor element or in the deterioration of the electric characteristics of that element. On the other hand, the reinforcing member 30 according to the invention is in the form of an annular member joined only to the outer peripheral portion of one of the main faces of the associated semiconductor element but not to the central portion thereof. This shape of the reinforcing member cooperates with the material therefor scarcely different in coefficient of thermal expansion from the material for the semiconductor element to prevent the latter element from flexing due to the heat as above described.

Further in the conventional reinforcing elements composed of molybdenum, tantalum or tungsten, such a metal is corroded with the particular etching solution in the etching step as previously described to form cations thereof which can, in turn, adhere to the surface of the semiconductor element to deteriorate the surface condition thereof. However the corrosion of the material for the reinforcing element of the invention in the etching step does not cause the surface of the associated semiconductor element to be contaminated. This is because both the elements are similar in type of material to each other and the cations also identical in type to those of the semiconductive material may adhere to the surface of the semiconductor element.

In addition, it will be appreciated that the reinforcing element is joined to the outer peripheral portion which is apt to damage the semiconductor element thereby to effectively protect the latter element from damaging or breaking particularly in the sandblasting and succeeding steps as previously described. Also the use of materials of the same type for the semiconductor and reinforcing elements is advantageous in that large-sized semiconductor devices decrease in weight resulting in their being easily handled by a pincette or the like during the manufacturing operation.

It has been found that the reinforcing member can be formed of any suitable material having a coefficient of thermal expansion approximating that of he material for the semiconductor element rather than of a material of the same type as that for the semiconductor element with satisfactory results. Suitable examples of such materials involve germanium, molybdenum, tantalum, tungsten, iron-nickel-cobalt alloy, alumina, zirconia and mixtures and alloys thereof for semiconductor elements made of silicon. However it is to be noted that, in order to prevent the particular material for the reinforcing element from contaminating the associated semiconductor wafer in the etching step, it is required to fully coat the reinforcing element with an etch-resisting material.

Figure 5:
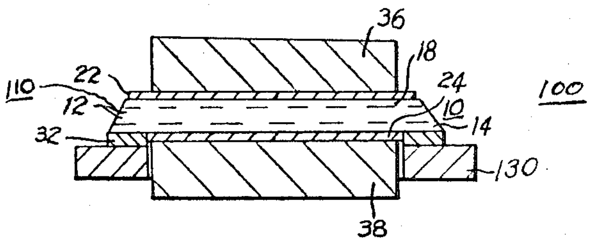
FIG. 5 is a side elevational view, partly in section of a modification of the invention.

In FIG. 5, wherein the same reference numerals designate the components corresponding to those illustrated in FIGS. 1 to 4 inclusive, there is illustrated a semiconductor device 100 including a semiconductor element 110 substantially identical to that as previously described and a reinforcing member 130 made of molybdenum into a toroid substantially identical to that shown in FIG. 2. The device illustrated may be produced in the manner as previously described. In the example illustrated, however, the reinforcing element 130 of molybdenum in the form of a toroid was first metallized on one of the end faces with an aluminum layer 32 and then brazed to a semiconductor wafer prepared in the same manner as the wafer shown in FIG. 1, in a vacuum atmosphere at 700° C. Thereafter aluminum was vapor deposited on the exposed surfaces of an $N^+$ type and a P type diffusion layer 22 and 24 serving as an anode and a cathode electrode.

Then the sandblasting and succeeding steps as previously described in conjunction with FIGS. 2 to 4 inclusive are repeated to complete the device having a pair of supporting circular plates 36 and 38 in intimate contact with the anode and cathode layers 22 and 24 respectively with the opposite main faces of each plate lapped into parallel planes. The supporting plate may be preferably composed of a metallic material approximating in coefficient of thermal expansion the material for the semiconductor element and in this case the plates 36 and 38 were of molybdenum. The circular plate may have preferably a diameter of 30 mm. and a thickness of from 1.5 to 2.0 mm. for the reinforcing element having an outside diameter of 37 mm., an inside diameter of 31 mm. and a thickness of from 0.50 to 1.0 mm. The device is resiliently fixed in place within an enclosed casing (not shown) as previously described.

When the semiconductor element 110 and reinforcing member 130 are subject to heat during manufacturing or in operation, the element 110 increases in radius while the member 130 increases in outside and inside radii. Assuming that the material for the reinforcing element 130 is slightly greater in coefficient of thermal expansion than the material for the semiconductor element 110, the element 130 is greater in expansion at the junction than the element 110 with the result that the junction is subjected to a force which tends to flex the semiconductor element 110. However such a force is not exerted upon the central portion of the element 110 because that portion is not joined to the reinforcing member 130.

As a result, the use of the reinforcing member 130 in the form of an annular member permits the force tending to flex the semiconductor element 110 to decrease as compared with the use of a reinforcing element joined to the entire area of one of the main surfaces of the element 110. This leads to a decrease in strain occurring in the semiconductive material due to its flexure. Therefore the outer peripheral portion of the element 110 is prevented from cracking and the completed device is also prevented from deteriorating in electric characteristics.

It has been found that the reinforcing member such as the elements 30 and 130 shown in FIGS. 2 to 4 and FIG. 5 is effective for reinforcing a semiconductor element composed of germanium and preventing its electric characteristics from deteriorating.

While the invention has been described in terms of semiconductor diodes it is to be understood that the same is equally applicable to various semiconductor devices, such as transistors, thyristors, etc., other than diodes. As an example, the invention will be described as being applied to a thyristor such as shown in FIG. 6.

Figure 6:
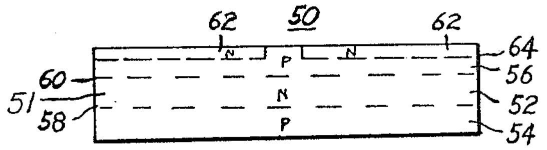
FIG. 6 is a side elevational view of a semiconductor element used in a thyristor to which the invention is applicable.

In FIG. 6 the thyristor element generally designated by the reference numeral 50 comprises a circular wafer 51 of any suitable semiconductor material, in this case, silicon, including a substrate 52 of N type conductivity having a high resistivity, a pair of P type diffusion layers 54 and 56 sandwiching the substrate 52 to form PN junctions 58 and 60 respectively, and an annular N type diffusion layer 62 disposed on the P type diffusion layer 56 to form an annular PN cathode junction 64 therebetween. The central portion of the N type layer 56 is exposed to the upper surface of the wafer. The wafer is of an NPNP configuration capable of being readily produced by the well-known diffusion technique. The N type substrate 52 and the P type diffusion layer 56 constitute bases and the P type and N type diffusion layers 54 and 62 respectively constitute emitters. The PN junctions 58 and 60 serves as barriers for blocking the reverse and forward currents respectively.

The reinforcing member 80 is comprised of any suitable material approximating in coefficient of thermal expansion the material for the thyristor element 50, in this case, silicon, for example, of alumina or zirconia into a toroid of rectangular cross section having an outside diameter slightly greater than the element 50 and an appropriate inside diameter. One end face of the toroid is suitably metallized as by applying a layer 82 of silver solder thereto. Another reinforcing element 80 of the same shape is similarly prepared.

Then both the reinforcing members are disposed and centered on both main faces of the thyristor element 50 with an annular foil 66 of aluminum or gold interposed therebetween. The assembly thus produced is then suitably heated to solder both the elements to each other whereby the reinforcing elements 80 reinforce the peripheral portion of the thyristor element 50.

Figure 7:
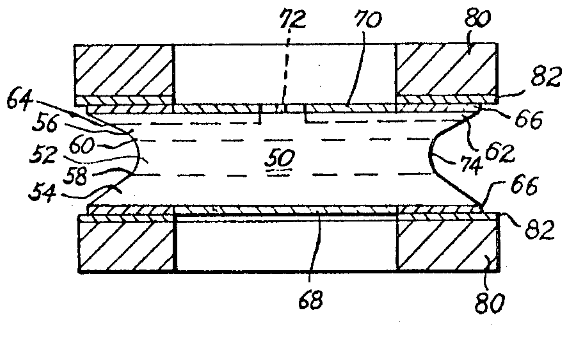
FIG. 7 is a side elevational view, partly in section of the semiconductor element of FIG. 6 having joined thereto a reinforcing element according to the invention.

Aluminum is vapor deposited on the entire area of the exposed portion of the P type diffusion layer 54 and the exposed portion of the annular P type diffusion layer 62 and the central portion of the exposed N type diffusion layer 56 on the upper surface of the element 50 secured to the reinforcing member 80 and sintered at from 500° to 600° C. to form ohmic contacts 68, 70 and 72 for the anode, cathode and gate diffusion layers 54, 62 and 56 respectively. As in the device previously described in conjunction with FIGS. 1 to 4 inclusive, a suitable acid-resisting mask covers the entire surface of the connected elements 50 and 80 except for the peripheral surface of the element 50 after which the periphery of the element 50 is etched with a suitable etching solution such as previously described to provide a concave surface 74 as shown in FIG. 7 for the purpose as previously described.

Then the assembly is processed as previously described to provide a finished device.

It is to be understood that if desired the reinforcing member 80 may be comprised of a material of the same type as that for the thyristor element 50 or of molybdenum, tungsten, tantalum, an iron-nickel-cobalt alloy and alloys and mixtures thereof. The member may also be comprised of germanium. For example, with the element 50 made of semiconductive silicon, the reinforcing elements may be formed of silicon inferior impurity to the silicon composing the semiconductor element. In this case there is no fear that the material for the reinforcing element will be corroded with the particular etching solution to deteriorate the surface condition of the thyristor element.

While the invention has been illustrated and described in terms of silicon, it is to be understood that the invention is equally applicable to semiconductor elements composed of germanium and compounds of the III–V elements for example gallium arsenide. Also the invention is equally applicable to semiconductor elements having any desired shape.

I claim:

1. A semiconductor device comprising a semiconductor element including a flat wafer of semiconductor material having a pair of opposite main faces, and a discrete reinforcing member attached to at least one of the main faces of the wafer, the reinforcing member having the form of an annulus extending beyond the periphery of said wafer and being joined only to the outer peripheral portion of the at least one main face of the wafer, the reinforcing element consisting of the same semiconductor material as the wafer.

2. A semiconductor device according to claim 1 characterized in that a reinforcing element as defined under claim 1 is joined to the outer peripheral portion of each of the opposite main faces of the wafer of semiconductive material.